US 12,433,178 B2

United States Patent
Wu

(10) Patent No.: US 12,433,178 B2
(45) Date of Patent: Sep. 30, 2025

(54) PCRAM STRUCTURE

(71) Applicant: TAIWAN SEMICONDUCTOR MANUFACTURING COMPANY, LTD., Hsinchu (TW)

(72) Inventor: Chao-I Wu, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 64 days.

(21) Appl. No.: 17/864,313

(22) Filed: Jul. 13, 2022

(65) Prior Publication Data

US 2022/0352462 A1    Nov. 3, 2022

Related U.S. Application Data

(62) Division of application No. 16/395,895, filed on Apr. 26, 2019.

(60) Provisional application No. 62/694,855, filed on Jul. 6, 2018.

(51) Int. Cl.
| | |
|---|---|
| *H10B 63/00* | (2023.01) |
| *H10N 70/00* | (2023.01) |
| *G11C 13/00* | (2006.01) |
| *H10N 70/20* | (2023.01) |

(52) U.S. Cl.
CPC ......... *H10N 70/8413* (2023.02); *H10B 63/20* (2023.02); *H10B 63/80* (2023.02); *H10B 63/84* (2023.02); *G11C 13/0004* (2013.01); *H10N 70/063* (2023.02); *H10N 70/066* (2023.02); *H10N 70/231* (2023.02); *H10N 70/826* (2023.02); *H10N 70/8828* (2023.02)

(58) Field of Classification Search
CPC .. H10B 63/00; H10B 63/10; H10B 63/20–24; H10B 63/80–84; H10N 70/066
See application file for complete search history.

(56) References Cited

U.S. PATENT DOCUMENTS

| | | |
|---|---|---|
| 9,406,881 B1 | 8/2016 | Tortorelli et al. |
| 2003/0047762 A1 | 3/2003 | Lowrey |
| 2011/0147692 A1 | 6/2011 | Park et al. |
| 2012/0199805 A1 | 8/2012 | Sorada et al. |
| 2015/0263069 A1 | 9/2015 | Jo |
| 2017/0117328 A1 | 4/2017 | Terai |
| 2017/0236873 A1 | 8/2017 | Chen et al. |

(Continued)

OTHER PUBLICATIONS

Non-Final Office Action issued in U.S. Appl. No. 16/395,895, dated Jan. 9, 2020.

(Continued)

*Primary Examiner* — Yu Chen
(74) *Attorney, Agent, or Firm* — STUDEBAKER BRACKETT PLLC

(57) ABSTRACT

A memory device includes the following items. A substrate. A bottom electrode disposed over the substrate. An insulating layer disposed over the bottom electrode, the insulating layer having a through hole defined in the insulating layer. A heater disposed in the through hole. A phase change material layer disposed over the heater. A selector layer disposed over the phase change material layer. An intermediate layer disposed over the through hole. Also, a metal layer disposed over the selector layer. The metal layer is wider than the phase change material layer.

20 Claims, 17 Drawing Sheets

(56) References Cited

U.S. PATENT DOCUMENTS

| | | |
|---|---|---|
| 2017/0237000 A1 | 8/2017 | Terai et al. |
| 2017/0244031 A1 | 8/2017 | Jeong et al. |
| 2018/0159032 A1* | 6/2018 | Park .................. H10N 70/8413 |
| 2019/0035851 A1 | 1/2019 | Tortorelli et al. |

OTHER PUBLICATIONS

Non-Final Office Action issued in U.S. Appl. No. 16/395,895, dated Jan. 11, 2021.
Final Office Action issued in U.S. Appl. No. 16/395,895, dated May 4, 2021.
Non-Final Office Action issued in U.S. Appl. No. 16/395,895, dated Aug. 16, 2021.
Final Office Action issued in U.S. Appl. No. 16/395,895, filed Feb. 9, 2022.
Non-Final Office Action issued in U.S. Appl. No. 16/395,895, dated Jul. 7, 2022.

* cited by examiner

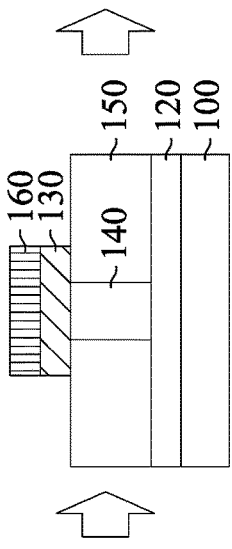
FIG. 8(a)
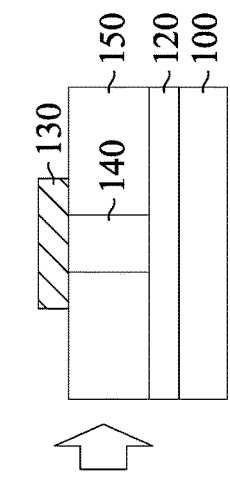
FIG. 8(b)
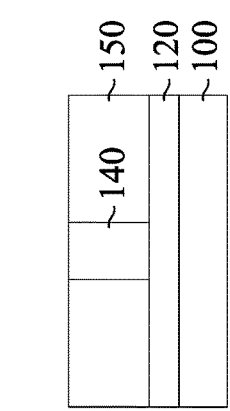
FIG. 8(c)
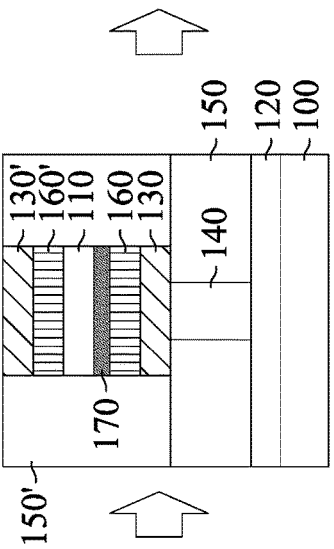
FIG. 8(d)
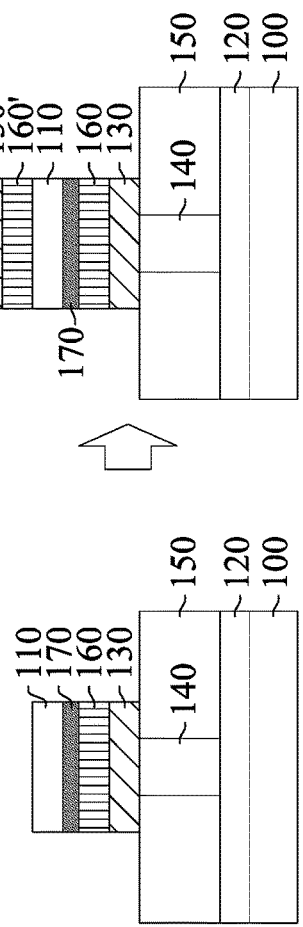
FIG. 8(e)
FIG. 8(f)
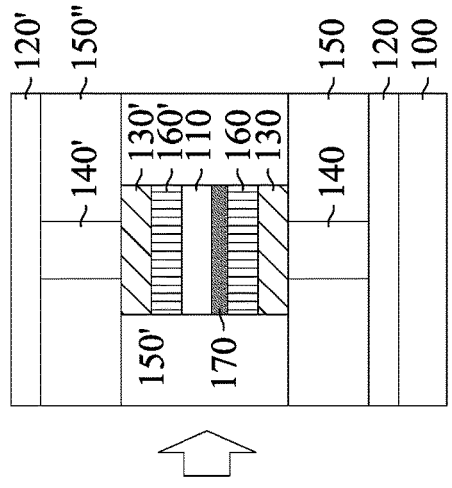
FIG. 8(g)
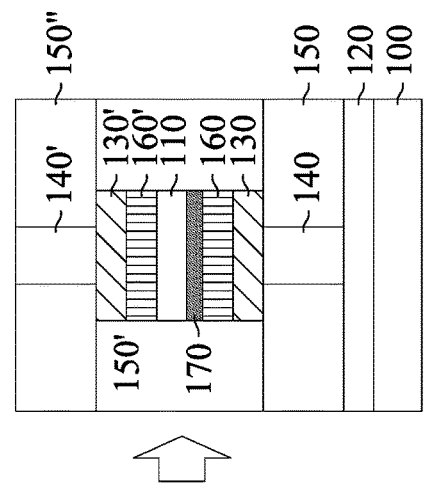
FIG. 8(h)
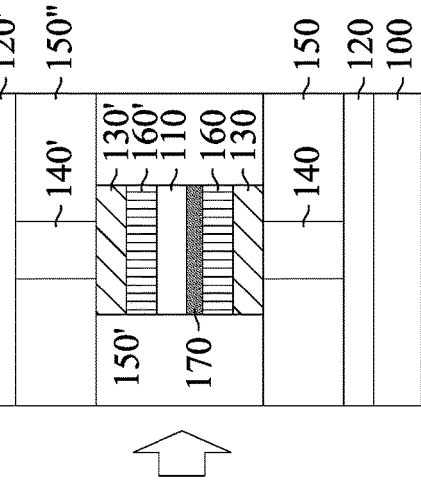
FIG. 8(i)

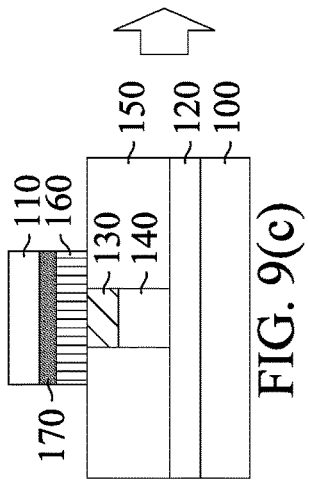
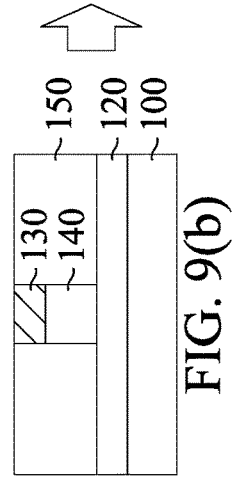
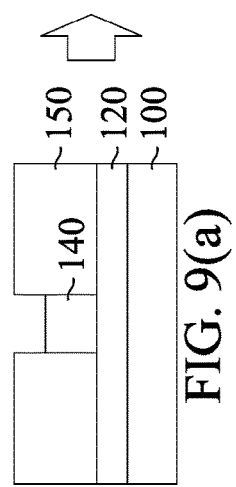
FIG. 9(a) FIG. 9(b) FIG. 9(c) FIG. 9(d) FIG. 9(e) FIG. 9(f) FIG. 9(g) FIG. 9(h)

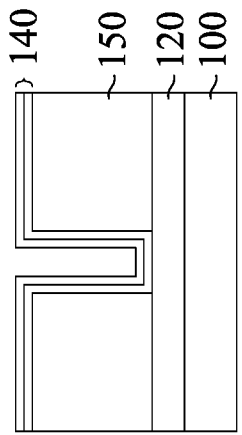
FIG. 12(c)
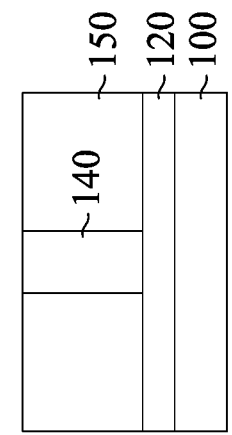
FIG. 12(f)
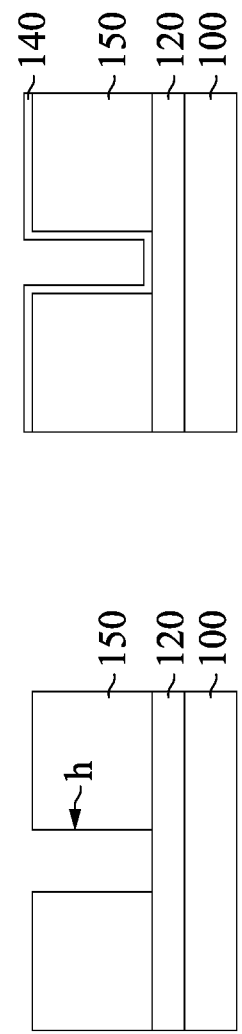
FIG. 12(b)
FIG. 12(e)
FIG. 12(a)
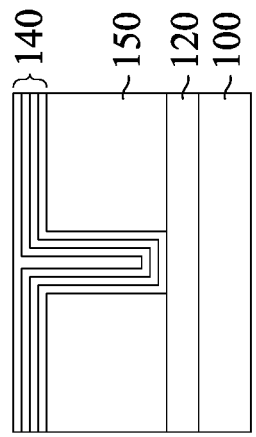
FIG. 12(d)
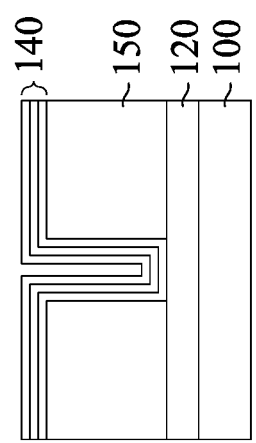

PCRAM STRUCTURE

CROSS-REFERENCE TO RELATED APPLICATIONS

This application is a Divisional of U.S. patent application Ser. No. 16/395,895, filed on Apr. 26, 2019, which claims priority to U.S. Provisional Patent Application 62/694,855 filed Jul. 6, 2018, the entire disclosure of the two applications are incorporated herein by reference.

TECHNICAL FIELD

The disclosure relates to a device of a phase change random access memory (PCRAM) and method of manufacturing the same. In particular, the present application discloses, in some embodiments of the present disclosure, a phase change random access memory (PCRAM) with full TaN bottom electrode (BE) structure and method of manufacturing the same.

BACKGROUND

Phase change random access memory (PCRAM) is a non-volatile memory device making use of different resistive phases and heat induced phase transition between the phases of phase change materials including chalcogenide and resistive materials. A PCRAM is composed of many cells each of which functions independently. A PCRAM cell mainly includes a heater and a resistor which is a data storage element made mainly of a reversible phase change material to provide at least two dramatically different resistivities for logical "0" state and "1" state.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 8(*a*), 8(*b*), 8(*c*), 8(*d*), 8(*e*), 8(*f*), 8(*g*), 8(*h*), and 8(*i*) show sequential manufacturing operations for forming a PCRAM according to embodiments of the present disclosure.

FIGS. 9(*a*), 9(*b*), 9(*c*), 9(*d*), 9(*e*), 9(*f*), 9(*g*), and 9(*h*) show sequential manufacturing operations for forming a PCRAM according to embodiments of the present disclosure.

FIGS. 12(*a*), 12(*b*), 12(*c*), 12(*d*), 12(*e*), and 12(*f*) show sequential manufacturing operations for forming a heater in a through hole according to embodiments of the present disclosure.

FIG. 14(*b*) shows an elemental analysis results.

DETAILED DESCRIPTION

Figure 1A:
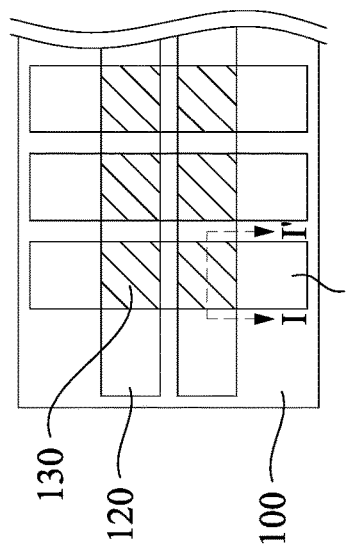
FIG. 1(*a*) shows a top view of a PCRAM according to an embodiment of the present disclosure, and FIG. 1(*b*) shows a cross-sectional view of the PCRAM along a cut line I-I' of FIG. 1(*a*).

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Generally, to read a state (data) from the PCRAM cell, a sufficiently small current is applied to the phase change material without triggering the heater to generate heat. In this way, the resistivity of the phase change material can be measured and the states representing the resistivities, i.e. a "0" state for high resistivity or a "1" state for low resistivity can be read. To write a state (data) in the PCRAM cell, for example, to write a "1" state representing a low resistivity phase of the phase change material, a medium electric current is applied to the heater which generates heat for annealing the phase change material at a temperature above the crystallization temperature but below the melting temperature of the phase change material for a time period to achieve a crystalline phase. To write a "0" state representing a high resistivity phase of the phase change material, a very large electric current is applied to the heater to generate heat to melt the phase change material at a temperature higher than the melting temperature of the phase change material; and the electric current is abruptly cut off to lower the temperature to below the crystallization temperature of the phase change material to quench and stabilize the amorphous structure of phase change material so as to achieve the high-resistance logical "0" state. The very large electric current can thus be in a pulse form. In the present disclosure, a PCRAM having improved cell structures are explained.

FIG. 1(a) shows a top view of a PCRAM having a substrate 100, a bottom electrode 120 formed over the substrate 100 where the bottom electrode may be a bit line, a phase change material layer 130 formed over the bottom electrode 120, and a metal layer 110 formed over the phase change material layer 130. In this embodiment, the size of the phase change material layer 130 is the same as the overlapped area between the bottom electrode 120 and the metal layer 110 which functions as a top electrode.

In some embodiments, the substrate 100 comprises a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 100 is made of crystalline Si. In some embodiments, the metal layer 110 and the bottom electrode 120 are formed of the same material or different materials, including one or more layers of conductive material, such as polysilicon, aluminum, copper, titanium, tantalum, tungsten, cobalt, molybdenum, carbon, tantalum nitride, nickel silicide, cobalt silicide, TiN, WN, TiAl, TiAlN, TaCN, TaC, TaSiN, metal alloys such as aluminum copper alloy, other suitable materials, and/or combinations thereof. Each of the metal layer 110 and the bottom electrode 120 has a thickness in a range from about 20 to about 2,000 nm in some embodiments. In some embodiments, the substrate 100 is a semiconductor-on-insulator substrate fabricated using separation by implantation of oxygen (SIMOX), wafer bonding, and/or other suitable methods, such as a silicon-on-insulator (SOI) substrate, a silicon germanium-on-insulator (SGOI) substrate, or a germanium-on-insulator (GOI) substrate. In some embodiments, the substrate 100 includes transistors such as MOSFET planar transistors, FinFETs, and Gate All Around (GAA) transistors, metal lines such as poly-lines and interconnect metal lines, and the transistors control the operations of the PCRAM. In some embodiments, the bottom electrode 120 is a metal line connected with the transistors included by the substrate 100.

Figure 1B:
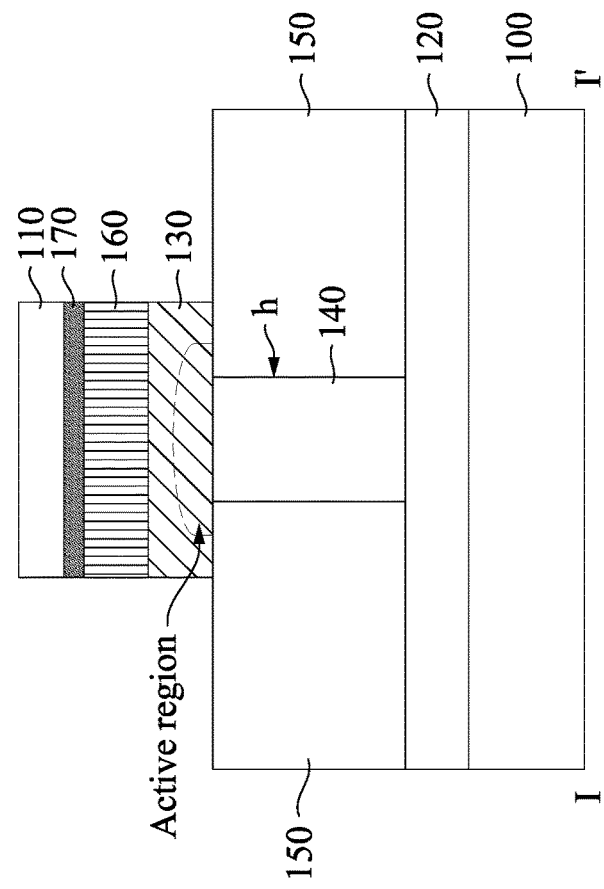

FIG. 1(b) shows a cross-sectional view of the PCRAM having insulating layer 150 which includes a through hole h. In the through hole h, a heater 140 is formed. In some embodiments, the heater 140 is formed of thin film material of TiN, TaN, or TiAlN that has a thickness in a range from about 5 to about 15 nm to provide Joule heating to the phase change material layer 130. Also, the heater 140 may function as a heat sink during quenching (during abrupt cutoff of the current applied to the heater 140 to 'freeze' the amorphous phase). The heater 140 fills the through hole h provided in the insulating layer 150 which prevents heat transfer between PCRAM cells so as to avoid thermal disturbance which may disable state retention or interrupt the read/write process.

In some embodiments, the insulating layer 150 is composed of, but not limited to, silicon oxide ($SiO_2$), silicon nitride ($Si_3N_4$), silicon oxynitride (SiON), SiOCN, SiCN, $Al_2O_3$, fluorine-doped silicate glass (FSG), a low-k dielectric material, or various other suitable dielectric materials used in manufacturing semiconductor devices. The insulating layer 150 disposed over the patterned bottom electrode 120 is an electrical and thermal insulator, and has a thickness in a range from about 5 to about 350 nm in some embodiments.

The phase change material layer 130 receives the heat generated by the heater 140, and a region (called "active region") close to the interface between the phase change material layer 130 and the heater 140 undergoes a phase transition from crystalline phase to amorphous phase or vice versa, depending on the amount and duration of heat generated when an electric current is applied to the heater 140. In the embodiment in FIG. 1(b), the active region has a mushroom-shape (FIG. 1(b)), while the region outside the active region does not undergo phase transition and may function as heat insulating layer to preserve the heat inside the mushroom-shaped active region. The smaller the active region, the less an amount of heat and thus less current is required for writing to the PCRAM cell. In some embodiments, the material of the phase change material layer 130 is a binary system of Ga—Sb, In—Sb, In—Se, Sb—Te, Ge—Te, and Ge—Sb; a ternary system, of Ge—Sb—Te, In—Sb—Te, Ga—Se—Te, Sn—Sb—Te, In—Sb—Ge, and Ga—Sb—Te; or a quaternary system of Ag—In—Sb—Te, Ge—Sn—Sb—Te, Ge—Sb—Se—Te, Te—Ge—Sb—S, Ge—Sb—Te—O, and Ge—Sb—Te—N. In some embodiments, the material for the phase change material layer 130 is a chalcogenide alloy containing one or more elements from Group VI of the periodic table, such as a GST, a Ge—Sb—Te alloy (e.g. $Ge_2Sb_2Te_5$) having a thickness of 5 to 100 nm. The phase change material layer 130 may include other phase change resistive materials, such as metal oxides including tungsten oxide, nickel oxide, copper oxide, etc. The phase transition between the crystalline phase and the amorphous phase of the phase change material is related to the interplay between the long range order and the short range order of the structure of the phase change material. For example, collapse of the long range order generates the amorphous phase. The long range order in the crystalline phase facilitates electrical conduction, while the amorphous phase impedes electrical conduction and results in high electrical resistance. To tune the properties of the phase change material layer 130 for different needs, the material of the phase change material layer 130 may be doped with various elements, e.g., B, Al, As, Ga, or P, at different amounts to adjust the proportion of the short range order and the long range order inside the bonding structure of the material. The doped element may be any element used for semiconductor doping through the use of, for example, ion implantation.

A selector layer 160 is formed over the phase change material layer 130, and a metal layer 110 and an intermediate layer 170 are formed over the selector layer 160. In a phase change memory array, for example, a cross-point array with hundreds or more memory cells, many problems disturbing the proper operation of a memory cell may occur. The problems may be electrical in nature, such as leakage current, parasitic capacitance, etc. The problems may also be thermal in nature, such as a thermal disturbance between memory cells. To solve the above problems, a switching device is used to reduce or avoid leakage current from an operating memory cell or from other memory cells passing along the resistive network. By using a switching device, the heaters of other memory cells would not be accidentally turned on by a leakage current, thereby wiping off the recorded states in the memory cells. A switching device functioning like a diode device or a transistor device is used so that only the intended PCRAM cells are selected for read/write while other PCRAM cells are not turned on, and to reduce or prevent leakage current originating from the selected PCRAM cells. To provide accurate read/write operations, a selector layer having high on-state conductivity and infinite off-state resistance is desired to be formed over the phase change material layer 130 to reduce the power dissipation in the resistive network of the PCRAM, leakage current and cross-talk disturbance, while making sure only the selected PCRAM cells are undergoing read/write operation. In this way, a reliable PCRAM can be formed. Considering the size of the switching device, a diode type (such as a p-n junction diode, a Schottky diode, a metal-insulator transition MIT, and an ovonic threshold switch OTS) device may have a smaller size than a transistor type (such as a MOSFET, metal-oxide-semiconductor-field-effect-transistor) device. The selector layer 160 may function as a diode type device with a diode junction formed within the selector layer 160. In FIG. 1(b), the selector layer is formed over and patterned with the phase change material layer 130 formed of the aforementioned materials to have the same size, greatly reducing the space within the PCRAM for the selector device which is considered a limiting factor for the shrinking trend of memory devices. In some embodiments, the selector layer 160 provides a current-voltage non-linearity to the PCRAM, and this reduces leakage current. The selector layer 160 has a single-layer or multi-layered structure, in some embodiments. In some embodiments, the selector layer 160 is made of a material including $SiO_x$, $TiO_x$, $AlO_x$, $WO_x$, $Ti_xN_yO_z$, $HfO_x$, $TaO_x$, $NbO_x$, or the like, or suitable combinations thereof, where x, y and z are non-stoichiometric values. In some embodiments, the selector layer 160 is a solid-electrolyte material containing one or more of Ge, Sb, S, Te or a chalcogenide such as N, P, S, Si, and/or Te doped chalcogenide such as N, P, S, Si, and/or Te doped AsGeSe, i.e. AsGeSe(N, P, S, Si, Te), and N, P, S, Si, and/or Te doped AsGeSeSi, i.e. AsGeSeSi(N, P, S, Si, Te). The thickness of the selector layer 160 is in a range from about 0.5 nm to about 50 nm. In some embodiments, the selector layer 160 is formed by chemical vapor deposition (CVD), pulsed laser deposition (PLD), sputtering, atomic layer deposition (ALD) or any other thin film deposition method.

The intermediate layer 170 is formed over the through hole h and between the selector layer 160 and the metal layer 110, in some embodiments of the present disclosure. The intermediate layer 170 may be formed of carbon, titanium, titanium nitride, tungsten, and titanium-tungsten with a thickness of about 1 to 50 nm and functions to prevent material diffusion into and contamination of the phase change material layer 130. In some embodiments, the intermediate layer 170 is formed by any vapor deposition method such as CVD, PLD, sputtering, ALD, or any other thin film deposition method. In some embodiments, the intermediate layer 170 reduces the incorporation of species from the metal layer 110 into the selector layer 160 and the phase change material layer 130. In some embodiments of the present disclosure, the in-plane size of the intermediate layer 170 is greater than the horizontal cross-sectional size of the through-hole h.

Figure 2A:
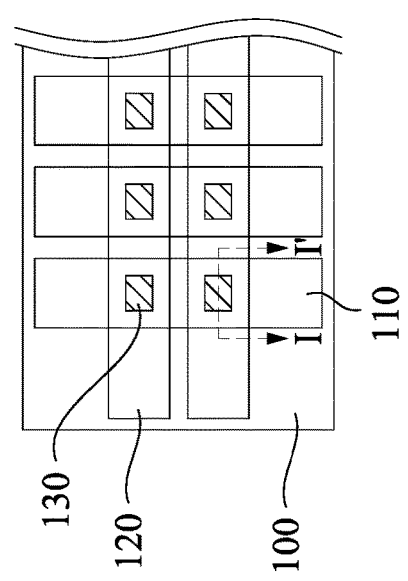
FIG. 2(*a*) shows a top view of a PCRAM according to another embodiment of the present disclosure, and FIG. 2(*b*) shows a cross-sectional view of the PCRAM along a cut line I-I' of FIG. 2(*a*).

FIG. 2(a) shows a top view of a PCRAM according to another embodiment of the present disclosure. Materials, configurations, dimensions, and/or processes explained with respect to FIGS. 1(a) and 1(b) may be employed in the following embodiments, and the detailed explanation thereof may be omitted.

The PCRAM has a substrate 100, a bottom electrode 120 formed over the substrate 100 where the bottom electrode may be a bit line, a phase change material layer 130 formed over the bottom electrode 120, and a metal layer 110 formed over the phase change material layer 130. In this embodiment, the size of the phase change material layer 130 is smaller than the overlapped area between the bottom electrode 120 and the metal layer 110 which functions as a top electrode. That is, the size of the phase change material layer 130 in the embodiment of FIG. 2(a) is smaller than the size of the phase change material layer 130 in the embodiment of FIG. 1(a). The smaller phase change material layer 130 provides a benefit of reduced operating electric current required to be supplied to the heater to heat the phase change material layer 130 for writing, and thus significantly reducing the overall power consumption of a memory having over a thousand phase change material layers 130.

Figure 2B:
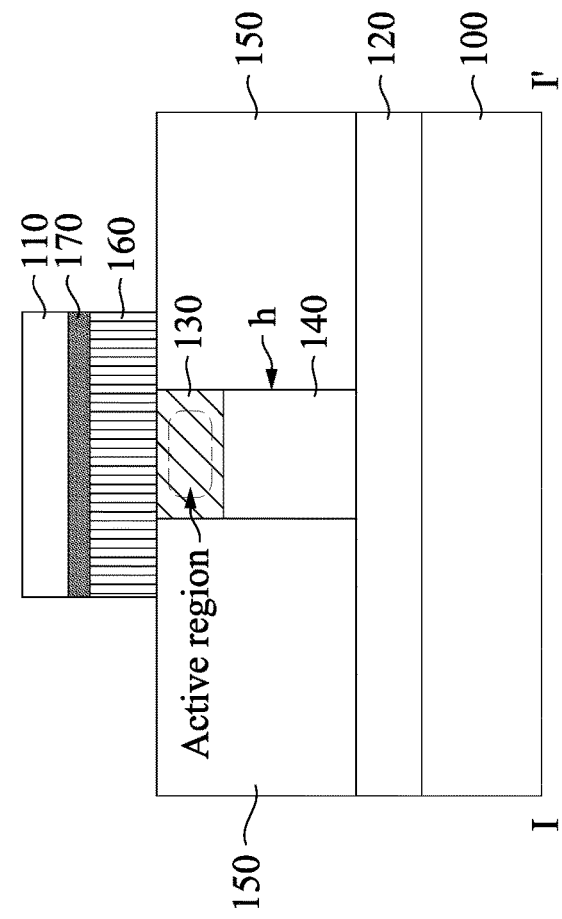

FIG. 2(b) shows a cross-sectional view of the PCRAM according to the embodiment shown in FIG. 2(a). The PCRAM has an insulating layer 150 which includes a through hole h. In the through hole h, a heater 140 is formed. In some embodiments, the heater 140 is formed of thin film material of TiN, TaN, or TiAlN that has a thickness in a range from about 5 to about 15 nm to provide Joule heating to the phase change material layer 130. Also, the heater 140 may function as a heat sink during quenching (during abrupt cutoff of the current applied to the heater 140 to 'freeze' the amorphous phase). The heater 140 fills the through hole h provided in the insulating layer 150 which prevents heat transfer between PCRAM cells so as to avoid thermal disturbance which may disable state retention or interrupt the read/write process. The phase change material layer 130 is formed in the through hole h and may contact the heater 140. In this way, the active region in the phase change material layer 130 undergoing phase transition during writing of the memory cell is different from that in FIG. 1(b) which has a mushroom shape. A selector layer 160 is formed over the phase change material layer 130 and has a size (width of about 25 nm to about 100 nm) greater than the phase change material layer 130 in the through hole having a width of about 10 nm. A metal layer 110 is formed over the selector layer 160 and functions as a top electrode for the read/write operation of the PCRAM cell.

The phase change material layer 130 receives the heat generated by the heater 140, and a region (called "active region") close to the interface between the phase change material layer 130 and the heater 140 undergoes a phase transition from crystalline phase to amorphous phase or vice versa, depending on the amount and duration of heat generated when an electric current is applied to the heater 140. In the embodiment in FIG. 2(b), the active region has an oval shape (FIG. 2(b)), while the region outside the active region does not undergo phase transition and may function as heat insulating layer to preserve the heat inside the active region. The smaller the active region, the less an amount of heat and thus less current is required for writing to the PCRAM cell.

A selector layer 160 is formed over the phase change material layer 130, and a metal layer 110 is formed over the selector layer 160. In FIG. 2(b), the selector layer 160 is formed over the phase change material layer 130 formed of the aforementioned materials to have a greater size than the phase change material layer 130, greatly enhancing the controllability and selectability of the phase change material layer 130. In some embodiments, the selector layer 160 provides a current-voltage non-linearity to the PCRAM, and this reduces leakage current. The selector layer 160 has the above structures. In some embodiments, the selector layer 160 is made of the above mentioned materials in the above description of FIG. 1(b). The thickness of the selector layer 160 is in a range from about 0.5 nm to about 50 nm. In some embodiments, the selector layer 160 is formed by CVD, PLD, sputtering, ALD, or any other thin film deposition method.

The intermediate layer 170 is formed over the through hole h and between the selector layer 160 and the metal layer 110, in some embodiments, similar to FIGS. 1(a) and 1(b).

Figure 3A:
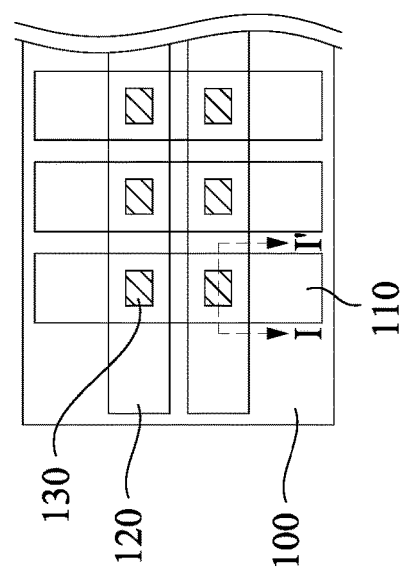
FIG. 3(*a*) shows a top view of a PCRAM according to another embodiment of the present disclosure, and FIG. 3(*b*) shows a cross-sectional view of the PCRAM along a cut line I-I' of FIG. 3(*a*).

FIG. 3(a) shows a top view of a PCRAM according to another embodiment of the present disclosure. Materials, configurations, dimensions, and/or processes explained with respect to FIGS. 1(a) to 2(b) may be employed in the following embodiments, and the detailed explanation thereof may be omitted.

The PCRAM has a substrate 100, a bottom electrode 120 formed over the substrate 100 where the bottom electrode may be a bit line, a phase change material layer 130 formed over the bottom electrode 120, and a metal layer 110 formed over the phase change material layer 130. In this embodiment, the size of the phase change material layer 130 is smaller than the overlapped area between the bottom electrode 120 and the metal layer 110 which functions as a top electrode. That is, the size of the phase change material layer 130 in the embodiment of FIG. 3(a) is smaller than the size of the phase change material layer 130 in the embodiment of FIG. 1(a). The smaller phase change material layer 130 provides a benefit of reduced operating electric current required to be supplied to the heater to heat the phase change material layer 130 for writing, and thus significantly reducing the overall power consumption of a memory having over a thousand phase change material layers 130.

Although the top view is the same as that shown in FIG. 2(a), the device structure is different from FIG. 2(b). The PCRAM has an insulating layer 150 which includes a through hole h. In the through hole h, a heater 140 is formed. In some embodiments, the heater 140 is formed of thin film material of TiN, TaN, or TiAlN that has a thickness in a range from about 5 to about 15 nm to provide Joule heating to the phase change material layer 130. Also, the heater 140 may function as a heat sink during quenching (during abrupt cutoff of the current applied to the heater 140 to 'freeze' the amorphous phase). The heater 140 fills the through hole h provided in the insulating layer 150 which prevents heat transfer between PCRAM cells so as to avoid thermal disturbance which may disable state retention or interrupt the read/write process.

Figure 3B:
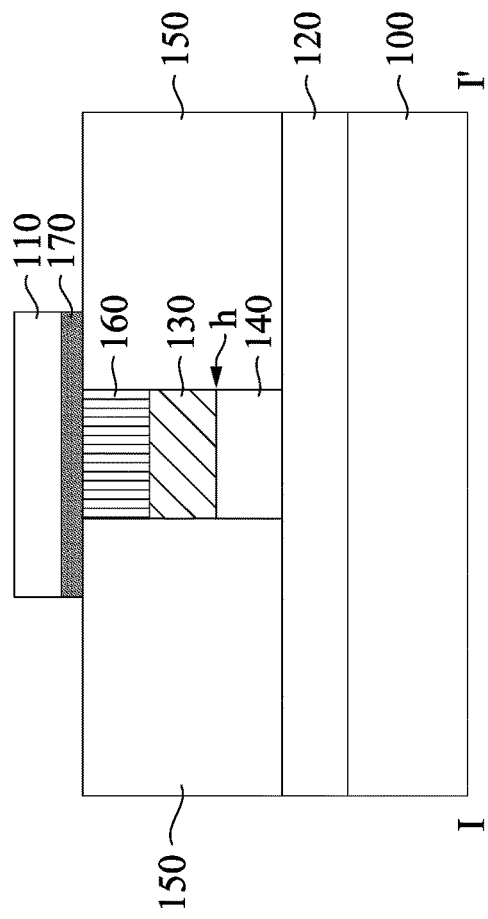

Also, as shown in the cross-sectional view in FIG. 3(b), the selector layer 160 is formed in the through hole h, greatly reducing the space occupied by the selector device in the PCRAM cell. A metal layer 110 is formed over the selector layer 160 and functions as a top electrode for the read/write operation of the PCRAM cell.

A selector layer 160 is formed over the phase change material layer 130, and a metal layer 110 is formed over the selector layer 160. In FIG. 3(b), the selector layer is formed over and patterned with the phase change material layer 130 formed of the aforementioned materials to have the same size, greatly reducing the space within the PCRAM for the selector device which is considered a limiting factor for the shrinking trend of memory devices. In some embodiments, the selector layer 160 provides a current-voltage non-linearity to the PCRAM, and this reduces leakage current. The selector layer 160 has the above structures. In some embodiments, the selector layer 160 is made of the above mentioned materials in the above description of FIG. 1(b). The thickness of the selector layer 160 is in a range from about 0.5 nm to about 50 nm. In some embodiments, the selector layer 160 is formed by CVD, PLD, sputtering, ALD, or any other thin film deposition method.

The intermediate layer 170 is formed between the selector layer 160 and the metal layer 110, in some embodiments, similar to FIGS. (1b) and 2(b).

A stacked PCRAM structure greatly increases the memory cell density and capacity in some embodiments. FIGS. 4, 5(a), 5(b), and 6(a) to 6(c) show various embodiments having stacked three-dimensional (3D) structures. Materials, configurations, dimensions, and/or processes explained with respect to FIGS. 1(a)-3(b) may be employed in the following embodiments, and the detailed explanation thereof may be omitted.

Figure 4:
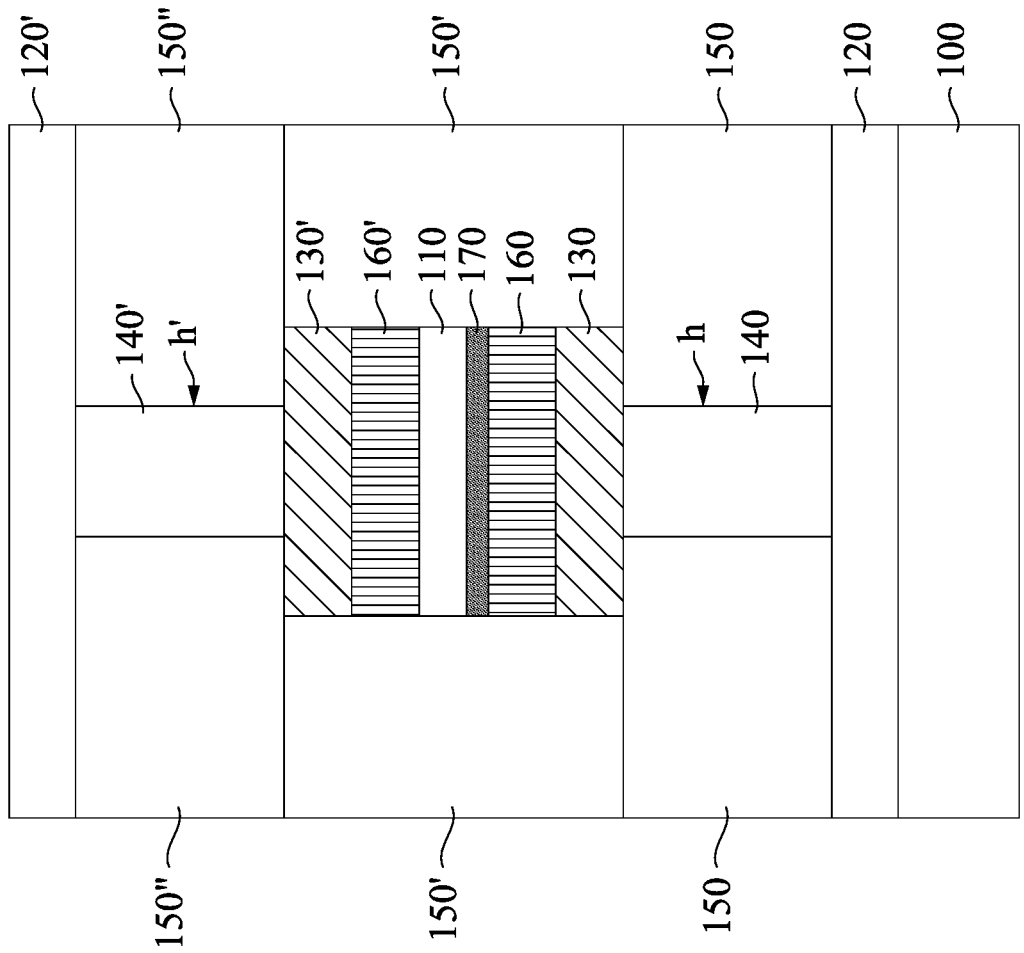
FIG. 4 shows a cross-sectional view of a PCRAM according to another embodiment of the present disclosure.

FIG. 4 shows a cross-sectional view of a stacked structure of a PCRAM including a bottom electrode 120 and top electrode 120'. Between the bottom electrode 120 and the top electrode 120', insulating layers 150, 150' and 150" are disposed. In some embodiments, the insulating layers 150, 150' and 150" are formed of the same materials described above with regard to FIGS. 1(b), 2(b), and 3(b). The insulating layers 150, 150', and 150" disposed over the patterned bottom electrode 120 are electrical and thermal insulators, and each has a thickness in a range from about 5 to about 350 nm in some embodiments. Also, in some embodiments, the insulating layers 150' and 150" are formed as one layer by a single operation. The insulating layers 150, 150' and 150", with the top and bottom electrodes 120' and 120, enclose a first heater 140 and a second heater 140', a first phase change material layer 130 and a second phase change material layer 130', a first selector layer 160 and a second selector layer 160', and a metal layer 110. The first and second heaters 140 and 140' are formed in a first through hole h and a second through hole h', respectively, while the other components occupy a greater space provided in the insulating layer 150'. Each of the through holes h and h' is formed between the first or second phase change material layer 130 or 130' and the top or bottom electrode 120 or 120'.

The intermediate layer 170 is formed over the through hole h and between the selector layer 160 and the metal layer 110, in some embodiments of the present disclosure.

The embodiment shown in FIG. 4 has a symmetrical structure with the device components arranged with respect to the metal layer 110 and the intermediate layer 170. Each of the first and second phase change material layers 130 and 130' can be operated independently, and in this device structure, instead of four electrodes, only three electrodes, e.g. the bottom electrode 120, the top electrode 120' and the metal layer 110, are required to operate the two phase change material layers 130 and 130'. In this way, an electrode is eliminated and the device thickness is reduced, and the device structure and processing are simplified with reduced manufacturing cost and simplified manufacturing operations. Also, since the entire device is enclosed by the insulating layers 150, 150', and 150", the thermal disturbance and electrical disturbance, such as leakage current, are beneficially reduced. Also, because of the higher thermal insulation property, the electric current for writing the memory cell is reduced in some embodiments as the temperature of phase transition within this highly insulating system can be achieved by a lower electric current. Depending on the choice of heater material of the heaters 140 and 140', the efficiency of the entire stacked device can be greatly increased in some embodiments.

The embodiment in FIG. 4 stacks two of the devices of the embodiment of FIG. 1(a) along a vertical direction to form a stacked device; however, other possibilities are included in this disclosure, as would be appreciated by one of ordinary skill in the art. For example, in some embodiments, the lower half of the device is formed by the structure of the embodiment in FIG. 1(a) and the upper half of the device is, for example, formed by the structure of the embodiment in FIG. 2(b), forming a non-symmetrical 3D structure of a PCRAM.

Figure 5A:
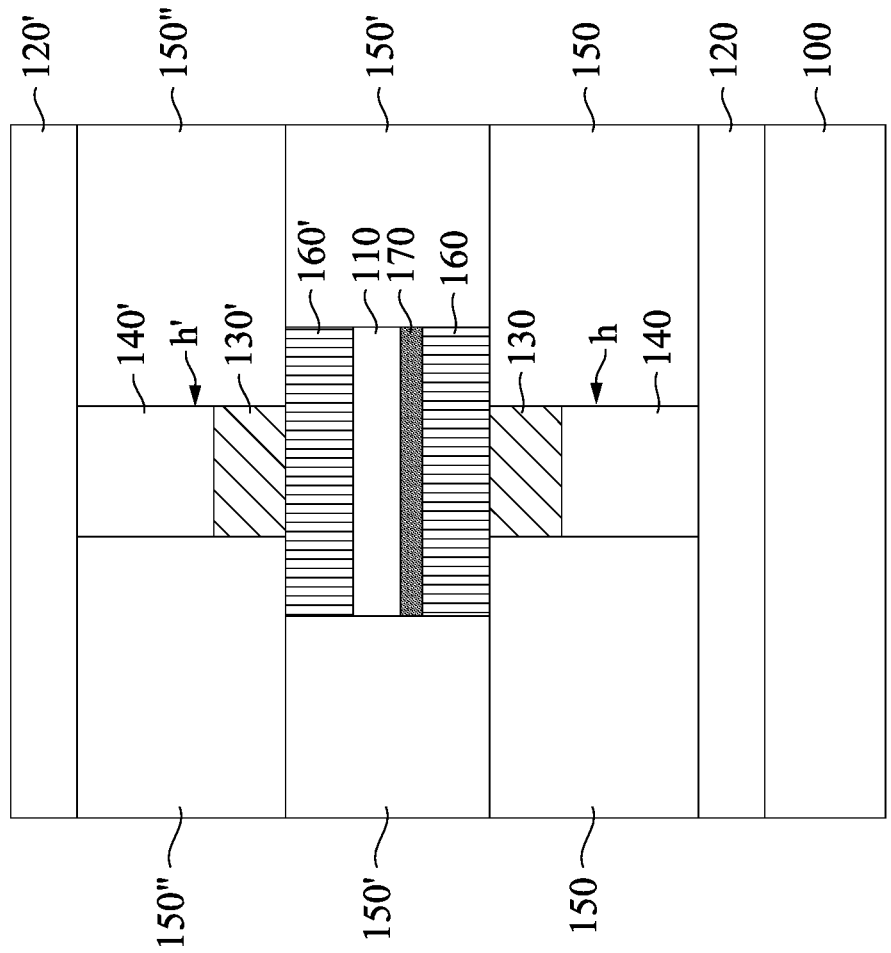
FIG. 5(*a*) shows a cross-sectional view of a PCRAM according to another embodiment of the present disclosure, and FIG. 5(*b*) shows a cross-sectional view of an alternative embodiment of the PCRAM of FIG. 5(*a*).

FIG. 5(a) shows a stacked device having a stacked structure symmetrical with respect to the metal layer 110. The stacked device includes phase change material layers 130 and 130' on opposing sides of the metal layer 110 formed in the through holes h and h' that contact the heaters 140 and 140' in some embodiments. In this way, the active regions undergoing phase transition during writing of the memory cell is different from that in FIGS. 1(a) and 4 which have a mushroom shape. The smaller phase change material layers 130 and 130' significantly lower the operating electric current and reduce the overall power consumption of a memory having over a thousand phase change material layers in some embodiments. First selector layer 160 and second selector layer 160' are formed over the respective first phase change material layer 130 and second phase change material layer 130'. The first selector layer 160 and second selector layer 160' are larger than the respective first and second phase change material layers 130 and 130'. The second selector layer 160' is formed of the same material as the selector layer 160, in some embodiments. In some embodiments, the second selector layer 160' is formed of a material in the above group of materials used to make the selector layer 160, which is different from the selector layer 160. In some embodiments, the selector layer 160' has the same layered-structure as the selector layer 160. In some embodiments, the selector layer 160' has a different layered-structure than the selector layer 160, for example, but not limited to, the selector layer 160' has a single-layer structure while the selector layer 160 has a multi-layered structure. The intermediate layer 170 is formed over the through hole h and between the selector layer 160 and the metal layer 110, in some embodiments of the present disclosure.

Figure 5B:
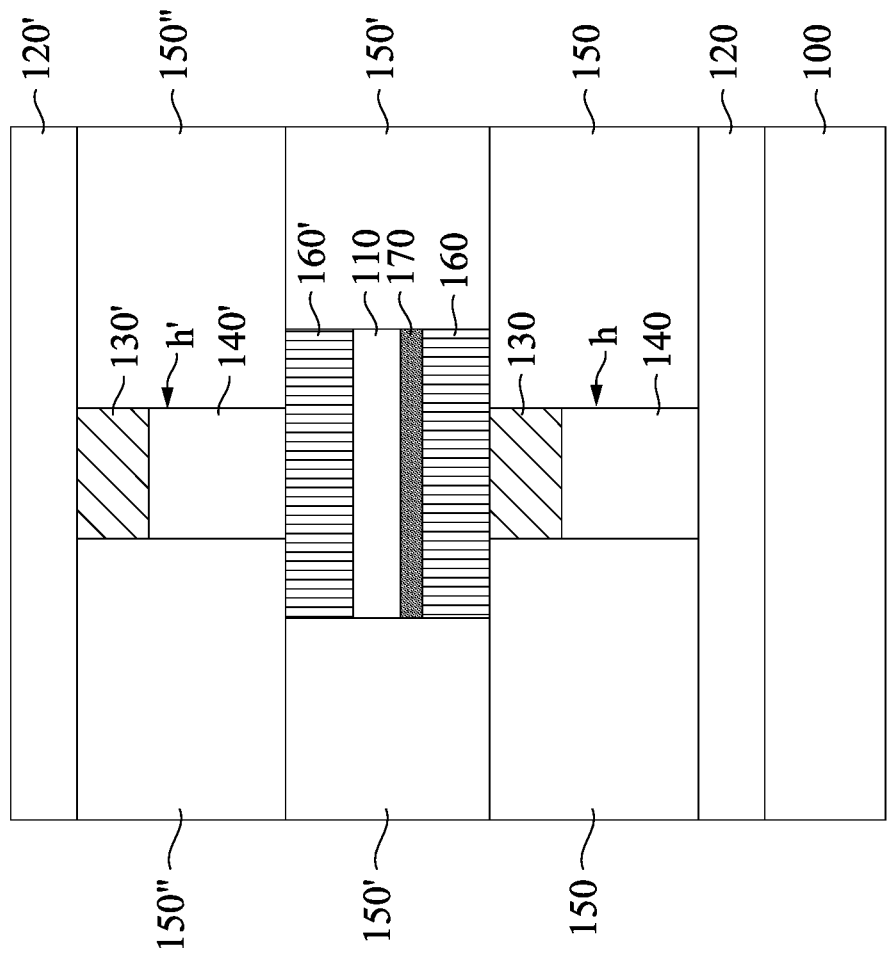

FIG. 5(b) shows an alternative embodiment of the embodiment shown in FIG. 5(a). FIG. 5(b) shows a non-symmetrical structure with respect to the metal layer 110, while FIG. 5(a) shows a symmetrical structure. In FIG. 5(b), the second phase change material layer 130' is formed over the second heater 140', spaced apart from the second selector layer 160'. In this embodiment, the second phase change material layer 130' receives heat generated from the top surface of the second heater 140'. If the heat transfer favors an upward direction, the arrangement of the second phase change material layer 130' over the second heater 140' may enhance the entire efficiency of the device. In this way, depending on the heat transfer direction within the memory device, the arrangement of the phase change material layers with respect to the heaters can be tailored to suit different needs with optimal efficiencies. The intermediate layer 170 is formed over the through hole h and between the selector layer 160 and the metal layer 110, in some embodiments of the present disclosure.

Figure 6A:
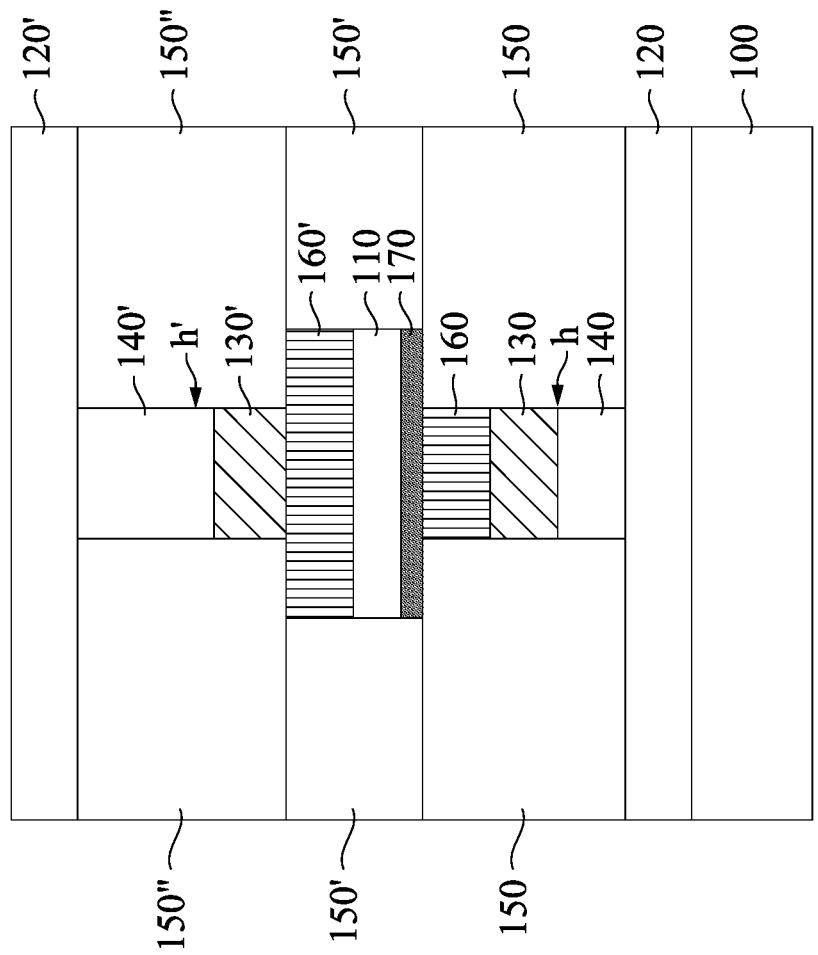
FIG. 6(*a*) shows a cross-sectional view of a PCRAM according to another embodiment of the present disclosure, and FIGS. 6(*b*) and 6(*c*) show cross-sectional views of alternative embodiments of the PCRAM of FIG. 6(*a*).
Figure 6B:
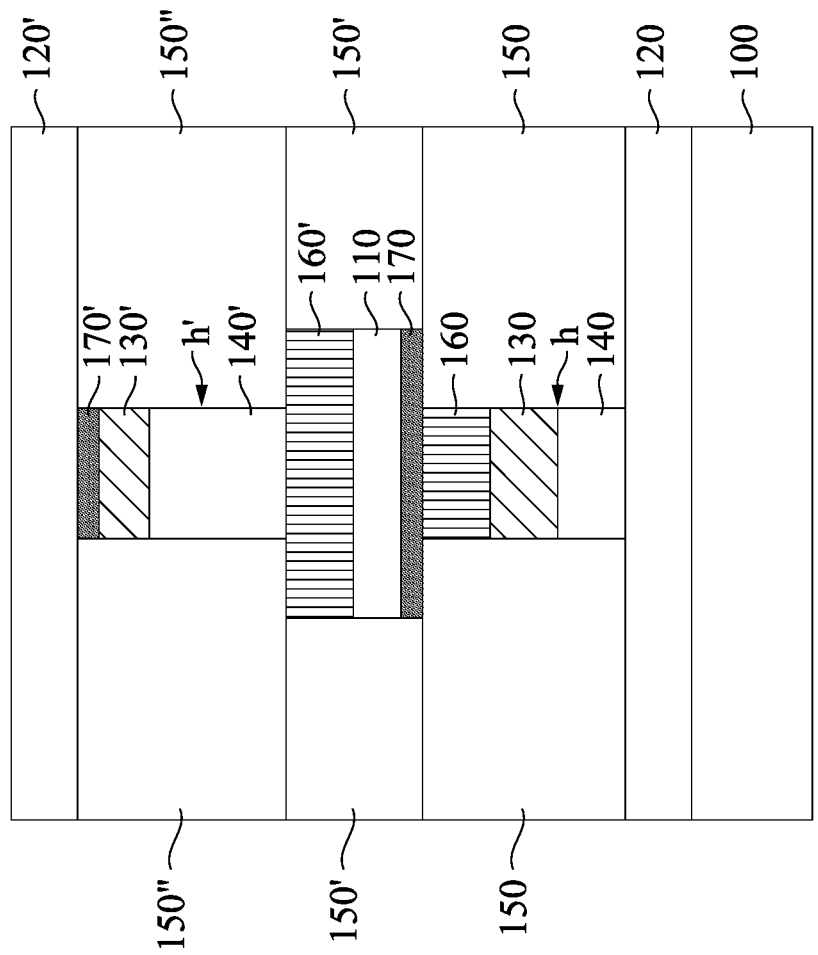
Figure 6C:
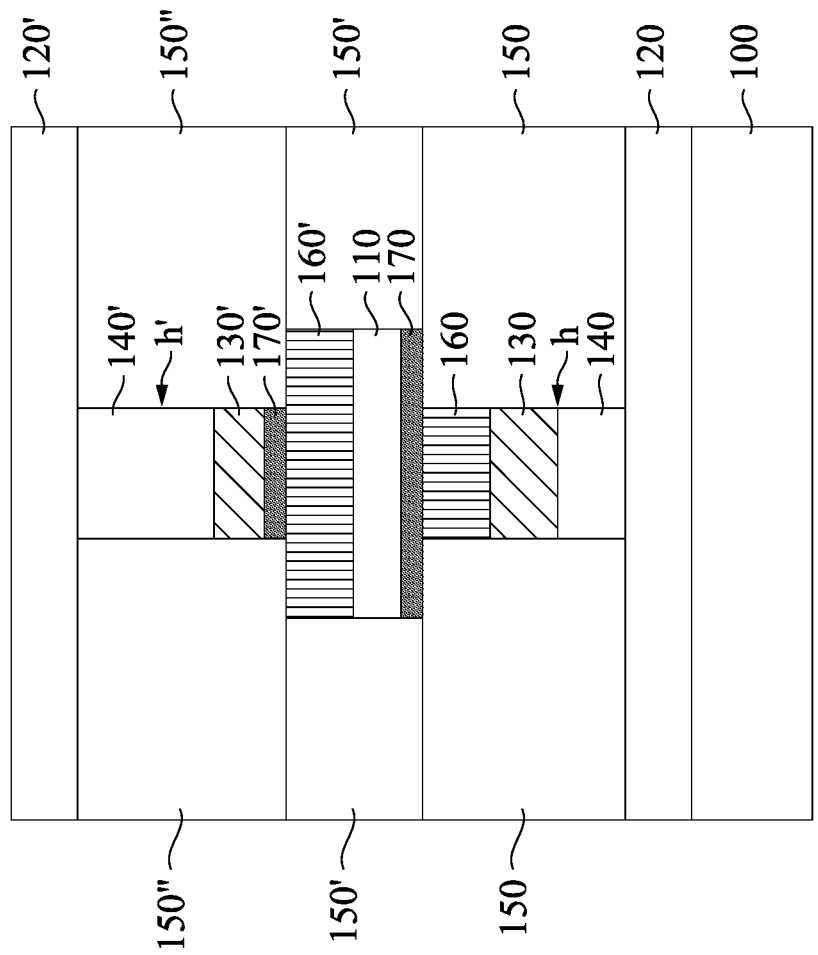

FIGS. 6(a), 6(b), and 6(c) show embodiments having an additional component, i.e. an intermediate layer 170'. FIG. 6(a) shows that the intermediate layer 170 is formed over the through hole h, between the phase change material layer 130 and the metal layer 110, in some embodiments of the present disclosure. The intermediate layer 170 is formed between the selector layer 160 and the metal layer 110, in some embodiments of the present disclosure.

FIG. 6(a) shows that the second phase change material layer 130' is formed between the second heater 140' and the second selector layer 160', in some embodiments of the present disclosure. FIG. 6(b) shows that the second phase change material layer 130' is formed over the second heater 140' between the second heater 140' and the top electrode 120', in some embodiments of the present disclosure. In some embodiments, an additional intermediate layer 170' is formed on the second phase change material layer 130'. FIG. 6(c) shows that an additional intermediate layer 170' is formed on the second selector layer 160', a second phase change material layer 130' is formed over the additional intermediate layer 170' and a second heater 140' is formed over the second phase change material layer 130', in some embodiments of the present disclosure. Depending on the heat transfer direction, FIGS. 6(a)-6(c) may enhance the overall efficiency of the PCRAM device.

In FIGS. 6(a), 6(b), and 6(c), the intermediate layers 170 and 170' are formed of carbon, titanium, titanium nitride, tungsten, and titanium-tungsten with a thickness of about 1 to 50 nm.

FIGS. 7(a)-7(f), 8(a)-8(i), 9(a)-9(h), and 10(a)-10(g) show the various manufacturing operations to make PCRAMs according to the above embodiments. It is understood that additional operations can be provided before, during, and after processes shown by FIGS. 7(a)-7(f), 8(a)-8(i), 9(a)-9(h), and 10(a)-10(g) and some of the operations described below can be replaced or eliminated, for additional embodiments of the methods. The order of the operations/processes may be interchangeable. Materials, configurations, dimensions, and/or processes explained with respect to FIGS. 1(a)-6(c) may be employed in the following embodiments, and the detailed explanation thereof may be omitted.

Figure 7A:
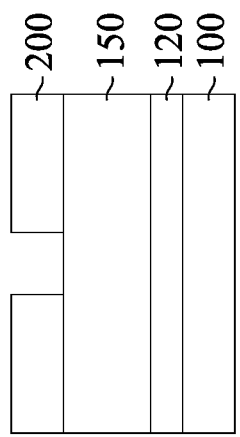
FIGS. 7(*a*), 7(*b*), 7(*c*), 7(*d*), 7(*e*), 7(*f*) and 7(*g*) show sequential manufacturing operations for forming a PCRAM according to embodiments of the present disclosure.

FIG. 7(a) shows an operation of forming a bottom electrode 120 over a substrate 100. In some embodiments, the substrate 100 is any substrate that can be used for an electronic memory device, including a single crystalline semiconductor material such as, but not limited to, Si, Ge, SiGe, GaAs, InSb, GaP, GaSb, InAlAs, InGaAs, GaSbP, GaAsSb and InP. In certain embodiments, the substrate 100 is made of crystalline Si. In some embodiments, the bottom electrode 120 is formed by evaporation or any vapor deposition method such as CVD, PLD, sputtering, ALD, or any other thin film deposition method. The bottom electrode 120 can be formed by patterning the formed layer using masking and etching processes such as UV photolithography. To enhance the insulating property between the PCRAM devices or cells, an insulating layer of e.g. silicon oxide is formed (by oxidation or any thin film deposition method) over the substrate 100 (not shown) before the bottom electrode 120 is formed on the substrate 100.

Figure 7B:
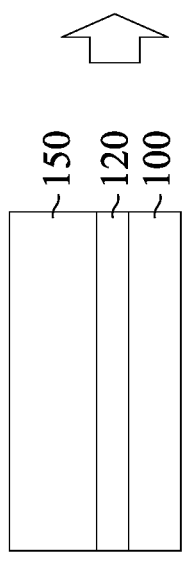

FIG. 7(b) shows an operation of forming an insulating layer 150 over the bottom electrode 120. The insulating layer 150 is a material selected from the group consisting of silicon oxide ($SiO_2$), silicon nitride ($Si_3N_4$), silicon oxynitride (SiON), SiOCN, SiCN, $Al_2O_3$, fluorine-doped silicate glass (FSG), a low-k dielectric material, and other suitable dielectric materials used in manufacturing semiconductor devices. In some embodiments, the insulating layer 150 is formed, for example, by CVD, such as low pressure chemical vapor deposition LPCVD, plasma-CVD or flowable CVD; PLD; sputtering; ALD; or any other thin film deposition method.

Figure 7C:
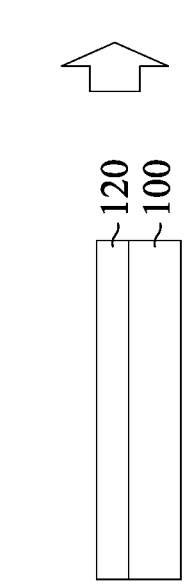
Figure 7D:
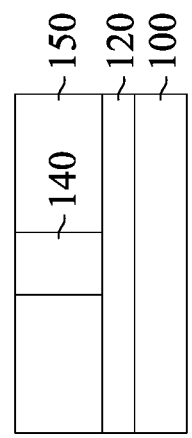

FIG. 7(c) shows an operation of forming a patterned photoresist layer 200 over the insulating layer 150. FIG. 7(d) shows an operation of etching the insulating layer 150 using isotropic etching, wet etching and/or dry etching. The etching forms a through hole h having a width of about 10 nm in the insulating layer 150, exposing the bottom electrode layer 120.

Figure 7E:
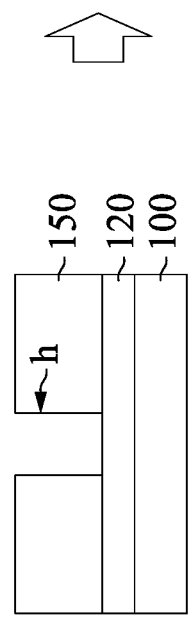

FIG. 7(e) shows an operation of forming a heater 140 in the through hole h. The heater 140 is formed by depositing a metal alloy layer over the insulating layer 150, followed by a chemical mechanical polishing CMP in some embodiments so that the top surface of the heater 140 is coplanar with the top surface of the insulating layer 150. The heater 140 formed in FIG. 7(e) is further etched to reduce the thickness in the through hole h, i.e. forming the embodiments in FIGS. 7(f) and 7(g).

The embodiment in FIG. 7(e) is continued in processing in FIG. 8(a) to form a stacked PCRAM device shown in FIG. 8(i), in some embodiments. FIG. 8(a) shows the embodiment depicted in FIG. 7(e). FIG. 8(b) shows an operation of forming a patterned phase change material layer 130 over the heater 140 by one or more thin film deposition and patterning methods. FIG. 8(c) shows an operation of forming a patterned selector layer 160 by one or more thin film deposition and patterning methods. FIG. 8(d) shows an operation of forming an intermediate layer 170 over the selector layer 160 and forming a metal layer 110 over the selector layer 160 by a thin film deposition and patterning method. Alternatively, in other embodiments, the layers 130, 160, 170, and 110 are formed together by forming the layers and then patterning the layers in a single step. The intermediate layer 170 is formed over the through hole h and between the selector layer 160 and the metal layer 110, in some embodiments of the present disclosure. The intermediate layer 170 may be formed of carbon, titanium, titanium nitride, tungsten, and titanium-tungsten with a thickness of about 1 to 50 nm and functions to prevent material diffusion into and contamination of the phase change material layer 130. In some embodiments, the intermediate layer 170 is formed by any vapor deposition method such as CVD, PLD, sputtering, ALD, or any other thin film deposition method. In some embodiments, the intermediate layer 170 reduces the incorporation of species from the metal layer 110 into the selector layer 160 and the phase change material layer 130. In some embodiments of the present disclosure, the in-plane size of the intermediate layer 170 is greater than the horizontal cross-sectional size of the through-hole h.

FIG. 8(e) shows an operation of forming and patterning the second selector layer 160' and the second phase change material layer 130' over the metal layer 110. In some embodiments, the layers 130, 160, 170, 110, 160' and 130' are patterned by more than one etching processes. FIG. 8(f) shows an operation of forming the insulating layer 150'. FIG. 8(g) shows an operation of forming a second through hole h' by forming photoresist layer and etching an insulating layer 150". In some embodiments, the insulating layers 150' and 150" are formed as one layer in one operation instead of two layers formed in two separate operations. Through hole h' is subsequently formed by etching the one insulating layer. In some embodiments, the insulating layers 150, 150' and 150" are formed of the same materials described above. FIG. 8(h) shows an operation of forming a second heater 140'. FIG. 8(i) shows an operation of forming a top electrode 120'. In this way, in the formed device in FIG. 8(i), the insulating layers 150, 150', and 150", together with the top electrode 120' and the bottom electrode 120, enclose the other components in this device, providing superior electrical and thermal insulating properties and reducing thermal and cross-talk disturbance.

Figure 7F:
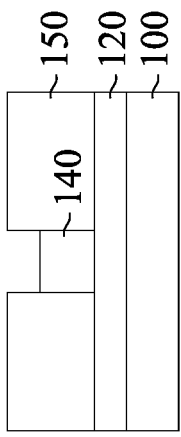
Figure 7G:
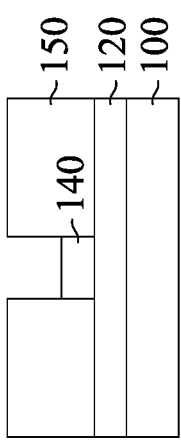
Figure 10B:
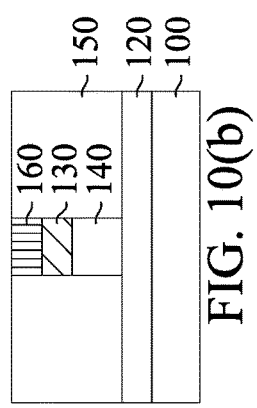
FIGS. 10(*a*), 10(*b*), 10(*c*), 10(*d*), 10(*e*), 10(*f*), and 10(*g*), show sequential manufacturing operations for forming a PCRAM according to embodiments of the present disclosure.
Figure 10A:
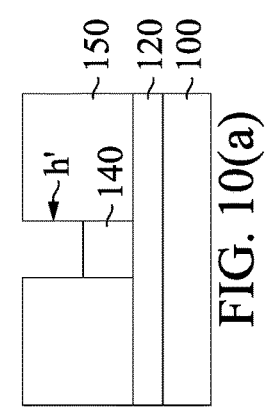
Figure 10E:
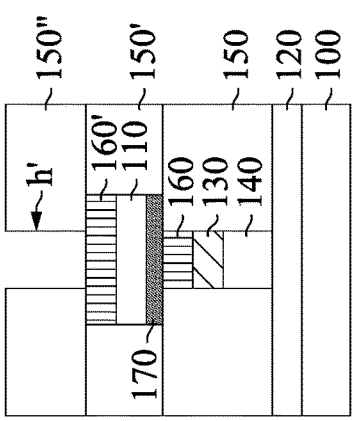
Figure 10C:
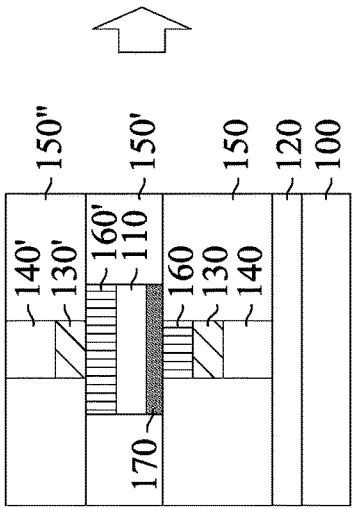
Figure 10F:
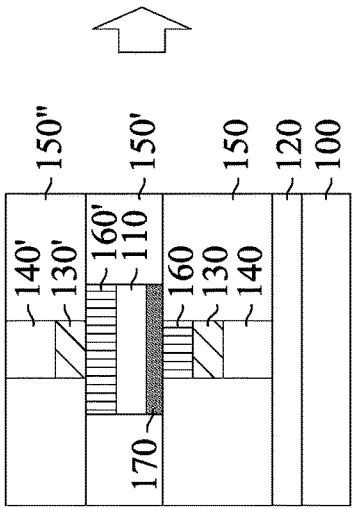
Figure 10D:
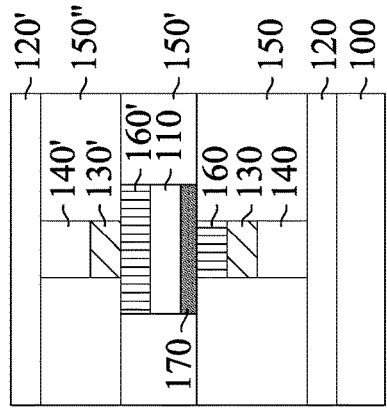
Figure 10G:
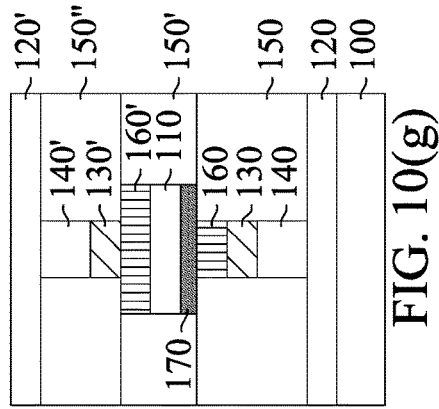

The embodiment in FIG. 7(f) is continued in processing in FIG. 9(a) to form the embodiment in FIG. 9(h) in some embodiments, and the embodiment in FIG. 7(g) is continued in processing in FIG. 10(a) to form the embodiment in FIG. 10(g) in other embodiments. FIG. 9(a) shows the embodiment depicted in FIG. 7(f). FIG. 9(b) shows an operation of forming a phase change material layer 130 in the through hole h and over the heater 140 by one or more thin film deposition methods. FIG. 9(c) shows an operation of forming a patterned selector layer 160, an intermediate layer 170, and a metal layer 110 by one or more thin film deposition and patterning methods. The intermediate layer 170 is formed over the through hole h and between the selector layer 160 and the metal layer 110, in some embodiments of the present disclosure. The intermediate layer 170 may be formed of carbon, titanium, titanium nitride, tungsten, and titanium-tungsten with a thickness of about 1 to 50 nm and functions to prevent material diffusion into and contamination of the phase change material layer 130. In some embodiments, the intermediate layer 170 is formed by any vapor deposition method such as CVD, PLD, sputtering, ALD, or any other thin film deposition method. In some embodiments, the intermediate layer 170 reduces the incorporation of species from the metal layer 110 into the selector layer 160 and the phase change material layer 130. In some embodiments of the present disclosure, the in-plane size of the intermediate layer 170 is greater than the horizontal cross-sectional size of the through-hole h.

FIG. 9(d) shows an operation of forming a second selector layer 160' by one or more thin film deposition and patterning methods. Alternatively, in other embodiments, the three layers 160, 110 and 160' are formed by thin film deposition methods and then patterned together using a patterning method. FIG. 9(e) shows an operation of forming the insulating layer 150'. FIG. 9(f) shows an operation of forming a second through hole h'. The second through hole h' is formed by photolithography and etching operations in some embodiments. In some embodiments, the insulating layers 150, 150' and 150" are formed of the same material described above. Also, in some embodiments, the insulating layers 150' and 150" are formed as one layer formed in one operation. FIG. 9(g) shows an operation of forming a second heater 140' in the second through hole h'. FIG. 9(h) shows an operation of forming a top electrode 120'. In this way, in the formed device in FIG. 9(h), the insulating layers 150, 150' and 150", together with the top electrode 120' and the bottom electrode 120, enclose the other components in this device, thereby providing superior electrical and thermal insulating properties and reducing thermal and cross-talk disturbance.

FIG. 10(a) shows the embodiment depicted in FIG. 7(g). FIG. 10(b) shows an operation of forming a first phase change material layer 130 and a first selector layer 160 in the through hole h and over the heater 140 by one or more thin film deposition and patterning methods. FIG. 10(c) shows an operation of forming patterned metal layer 110, an intermediate layer 170, and patterned second selector layer 160' by one or more thin film deposition and patterning methods. Alternatively, in other embodiments, the layers 110, 170, and 160' are formed and then patterned together using a patterning method. The intermediate layer 170 is formed over the through hole h and between the selector layer 160 and the metal layer 110, in some embodiments of the present disclosure. The intermediate layer 170 may be formed of carbon, titanium, titanium nitride, tungsten, and titanium-tungsten with a thickness of about 1 to 50 nm and functions to prevent material diffusion into and contamination of the phase change material layer 130. In some embodiments, the intermediate layer 170 is formed by any vapor deposition method such as CVD, PLD, sputtering, ALD, or any other thin film deposition method. In some embodiments, the intermediate layer 170 reduces the incorporation of species from the metal layer 110 into the selector layer 160 and the phase change material layer 130. In some embodiments of the present disclosure, the in-plane size of the intermediate layer 170 is greater than the horizontal cross-sectional size of the through-hole h.

FIG. 10(*d*) shows an operation of forming the insulating layer 150'. FIG. 10(*e*) shows another operation of forming a second through hole h' in the insulating layer 150'' using photolithography and etching operations in some embodiments. In some embodiments, the insulating layers 150' and 150'' are formed as one layer formed in a single operation. FIG. 10(*f*) shows an operation of forming a second heater 140' in the second through hole h'. FIG. 10(*g*) shows an operation of forming a top electrode 120'. In some embodiments, the insulating layers 150, 150' and 150'' are formed of the same materials described above. In this way, in the device in FIG. 10(*g*), the insulating layers 150, 150', and 150'', together with the top electrode 120' and the bottom electrode 120, enclose the other components in this device, thereby providing superior electrical and thermal insulating properties and reducing thermal and cross-talk disturbance.

Figure 11:
FIG. 11 shows a method of forming a PCRAM according to embodiments of the present disclosure.
Figure 13A:
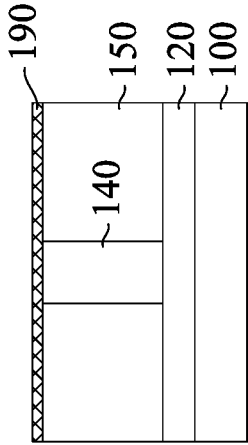
FIGS. 13(*a*), 13(*b*), 13(*c*), and 13(*d*) show sequential manufacturing operations for depositing a two-dimensional layer on top of the heater when forming a PCRAM according to embodiments of the present disclosure.
Figure 13B:
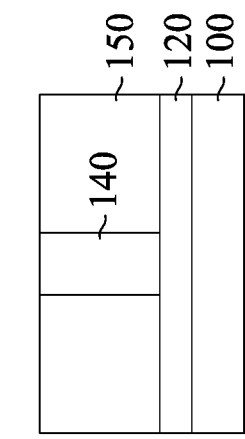
Figure 13C:
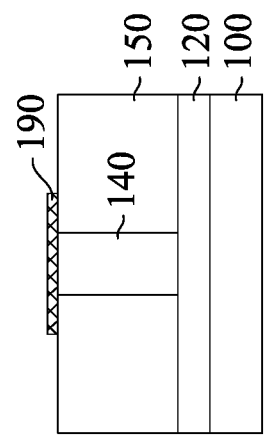
Figure 13D:
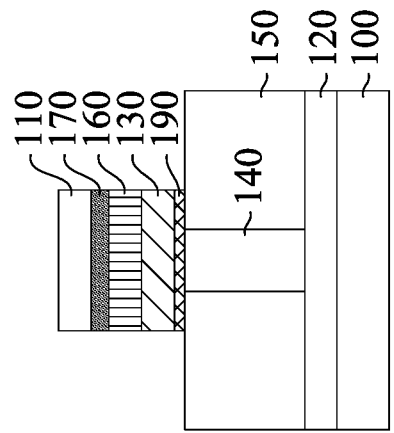

FIG. 11 shows a flowchart of a method of forming an embodiment of the present disclosure. The method includes operations S111: forming a bottom electrode over a substrate, S112: forming an insulating layer over the bottom electrode, S113: forming a through hole in the insulating layer, S114: forming a heater in the through hole, S115: forming a phase change material layer over the heater, S116: forming a selector layer over the phase change material layer, S117: forming an intermediate layer over the selector layer, and S118: forming a metal layer over the intermediate layer.

In particular, the operation S115 may include forming the phase change material layer over the insulating layer and over the heater, or forming the phase change material layer in the through hole of the insulating layer and over the heater. Also, the operation S116 may include forming the selector layer over the insulating layer and over the heater or forming the selector layer in the through hole of the insulating layer and over the heater. The process conditions of each operation include the details of the embodiments disclosed herein. Materials, configurations, dimensions, and/or processes explained with respect to FIGS. 1(*a*)-11 may be employed in the following embodiments, and the detailed explanation thereof may be omitted.

FIGS. 12(*a*), 12(*b*), 12(*c*), 12(*d*), 12(*e*), and 12(*f*) show sequential manufacturing operations for forming a heater in a through hole according to embodiments of the present disclosure. In some embodiments, FIG. 12(*a*) is consistent with FIG. 7(*d*) and FIG. 12(*f*) is consistent with FIG. 7(*e*) and FIGS. 12(*b*), 12(*c*), 12(*d*), and 12(*e*) show sequential manufacturing operations for forming heater 140 in the through hole h. As shown in FIGS. 12(*b*), 12(*c*), 12(*d*), and 12(*e*), a material, e.g., a metal alloy, that forms heater 140 in the through hole h, may be deposited in more than one step, e.g., in four steps. In each step, one layer of the material may be deposited in the through hole h, e.g. at the bottom and sides of the through hole h, and also may be deposited on top of insulating layer 150. FIGS. 12(*b*), 12(*c*), 12(*d*), and 12(*e*) respectively correspond to depositing one, two, three, and four layers. In some examples, after depositing four layers, the through hole h may be filled and the heater 140 may be formed. In some embodiments, in each step, a deposition method, e.g., ALD, may be used to deposit 40 Angstroms of the material and the sequential depositing of the layers may continue until the through hole h is filled. In some embodiments, after the through hole h is filled, a CMP may be applied on FIG. 12(*e*) such that the top surface of the heater 140 becomes coplanar with the top surface of the insulating layer 150 as shown in FIG. 12(*f*).

FIGS. 13(*a*), 13(*b*), 13(*c*), and 13(*d*) show sequential manufacturing operations for depositing a two-dimensional layer on top of the heater when forming a PCRAM according to embodiments of the present disclosure. Materials, configurations, dimensions, and/or processes explained with respect to FIGS. 1(*a*)-12(*f*) may be employed in the following embodiments, and the detailed explanation thereof may be omitted.

In some embodiments, FIG. 13(*a*) is consistent with FIG. 8(*d*) and FIGS. 13(*b*) and 13(*c*) show sequential manufacturing operations for forming two dimensional layer 190 on top of heater 140. The two-dimensional layer 190 of FIG. 13(*b*), which may be made of a material such as graphene or Molybdenum disulfide ($MoS_2$), with a thickness range of about 0.2 nm to about 2 nm in some embodiments may be deposited on top of heater 140 and on top of insulating layer 150. In other embodiments, the thickness of the two dimensional layer 190 is in a range from about 0.5 nm to about 1 nm. Then as shown in FIG. 13(*c*), the two-dimensional layer 190 may be patterned to have a top surface size to fit the phase change material layer 130 that will be deposited on top of the two-dimensional layer 190. As shown in FIG. 13(*d*), other layers that may include selector layer 160, intermediate layer 170, and metal layer 110 may be deposited on top of the phase change material layer 130. In some embodiments, after the two dimensional layer 190 is formed as shown in FIG. 13(*b*), layers for phase change material layer 130, selector layer 160, intermediate layer 170 and metal layer 110 are sequentially formed, and then by using one or more lithography and etching operations, the stacked layer is patterned to form the structure shown in FIG. 13*d*). In some embodiments, the operation performed in FIGS. 13(*b*) and 13(*c*) may be added between FIGS. 8(*a*) and 8(*b*).

Figure 14B:
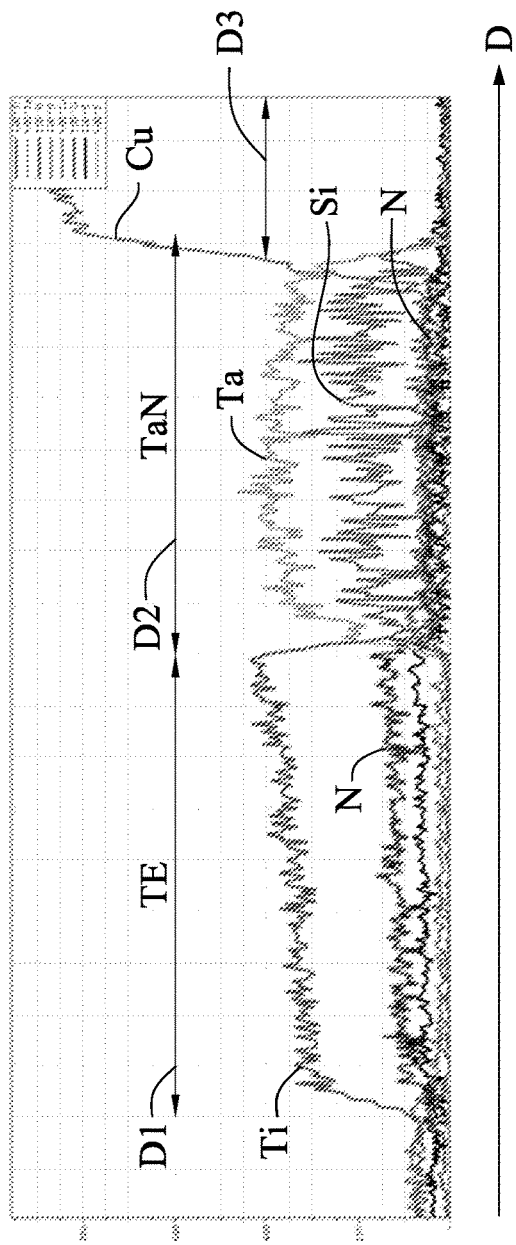
FIGS. 14(*a*) and 14(*c*) show a structure of top and bottom electrodes that are coupled to a heater.
Figure 14A:
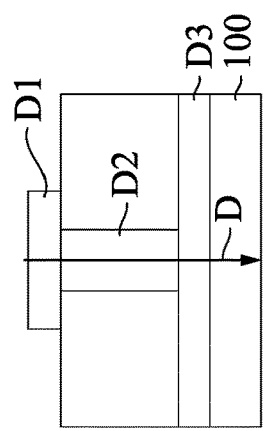
Figure 14C:
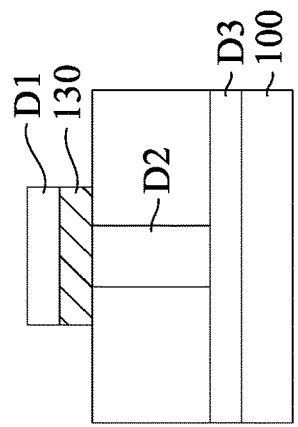

FIGS. 14(*a*), 14(*b*) and 14(*c*) show a structure of top and bottom electrodes that are coupled to a heater. FIG. 14(*a*) shows heater D2, consistent with heater 140 of FIG. 1(*b*), that is coupled between top electrode D1 and bottom electrode D3. Top electrode D1 and bottom electrode D3 are respectively consistent with metal layer 110 and bottom electrode 120 of FIG. 1(*b*). FIG. 14(*b*) shows a chart of elements that are includes in top electrode D1, heater D2, and bottom electrode D3 along a direction D as shown FIG. 14(*a*). As shown, top electrode D1 incudes Ti and N and thus may include titanium nitride (TiN). Bottom electrode D3 may include copper (Cu) and the heater D2 may include Ta, Si, and N and thus may include tantalum nitride (TiN) in a silicon substrate. FIG. 14(*c*) shows a structure of a memory cell with top electrode D1, bottom electrode D3, and heater D2 that also includes phase change material layer 130, between D1 and D2, and the memory cell structure is deposed on substrate 100. In some examples, the memory cell structure of FIG. 14(*c*) is used in PCRAM, ReRAM, MRAM, etc. In some embodiments, a two-dimensional layer such as two-dimensional layer 190 of FIG. 13(*d*) is included between D2 and phase change material layer 130. In some embodiments, selector layer 160 and/or intermediate layer 170 may be included between phase change material layer 130 and D1. In some examples, a material such as amorphous carbon, with higher resistivity that TiN can be used as heater 140. Amorphous carbon has a resistivity of 3.5E-3 (ohm-cm) which is greater than the resistivity 3.0E-4 (ohm-cm) of TiN, although the resistivity of amorphous carbon is less than the resistivity of TaN which is 7.0E-2 (ohm-cm). Amorphous carbon has a thermal conductivity of 1.1 (W/m-k) which is less than the thermal conductivity 20 (W/m-k) of TiN, and also less than the thermal conductivity of TaN which is 3 (W/m-k).

An embodiment according to the present disclosure includes a memory device having a substrate, a bottom electrode disposed over the substrate, and an insulating layer disposed over the bottom electrode. The insulating layer has a through hole defined in the insulating layer. A heater is disposed in the through hole. A phase change material layer is disposed over the heater. A selector layer is disposed over the phase change material layer, an intermediate layer is disposed over the through hole, and a metal layer disposed over the selector layer. In some embodiments, the intermediate layer is wider than the diameter of the through hole. In some embodiments, the metal layer is formed to be wider than the phase change material layer. In some embodiments, the phase change material layer is disposed in the through hole. In some embodiments, the selector layer is disposed in the through hole. In some embodiments, an intermediate layer contacts the metal layer. In some embodiments, the intermediate layer is formed of one of carbon and tungsten. In some embodiments, the metal layer functions as a top electrode.

Another embodiment according to the present disclosure includes a memory device having a substrate, a bottom electrode disposed over the substrate, and a first heater disposed over the bottom electrode. A first phase change material layer is disposed over the first heater. A first selector layer is disposed over the first phase change material layer. An intermediate layer (170) disposed over the first selector layer (160). A metal layer is disposed over the first selector layer. A second selector layer disposed over the metal layer. A second heater and a second phase change material layer are disposed over the second selector layer. A top electrode is disposed over the second heater and the second phase change material layer, and an insulating layer between the bottom electrode and the top electrode, encloses, with the bottom and top electrodes, the first and second heaters, the first and second selector layers, the first and second phase change material layers, and the metal layer. In some embodiments, the metal layer is formed to be wider than the first phase change material layer. In some embodiments, the second heater is disposed over the second phase change material layer. In some embodiments, the second phase change material layer is disposed over the second heater. In some embodiments, the intermediate layer is wider than the first and second heaters. In some embodiments, an intermediate layer contacts the metal layer. In some embodiments, the intermediate layer is formed of one of carbon and tungsten.

Another embodiment according to the present disclosure is a method of manufacturing a memory device. The method includes forming a bottom electrode over a substrate, forming an insulating layer over the bottom electrode, and forming a through hole in the insulating layer. A heater is formed in the through hole. A phase change material layer is formed over the heater. A selector layer is formed over the phase change material layer. An intermediate layer (170) is formed over the selector layer (160), and a metal layer is formed over the selector layer. In some embodiments, the intermediate layer (170) contacts the metal layer (110). In some embodiments, the phase change material layer is formed in the through hole. In some embodiments, the intermediate layer is formed of at least one of carbon and tungsten.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a memory device, comprising:
   forming a phase change random access memory (PCRAM) cell by performing operations comprising:
   forming a first metal layer over a substrate;
   forming a first insulating layer over the first metal layer;
   etching a first through hole in the first insulating layer;
   forming a first heater in the first through hole over the first metal layer;
   forming a first phase change layer in the first through hole over the first heater;
   forming a first selector layer over the first phase change layer;
   forming a first intermediate layer over the first selector layer and over the first through hole;
   forming a second metal layer over the first intermediate layer;
   forming a second selector layer over the second metal layer;
   forming a second insulating layer over the first insulating layer, wherein the second insulating layer surrounds the first intermediate layer, the second metal layer and the second selector layer;
   forming a third insulating layer over the second insulating layer and over the second selector layer;
   etching a second through hole in the third insulating layer;
   forming a second heater in the second through hole over the second selector layer;
   forming a second phase change layer in the second through hole over the second heater;
   forming a second intermediate layer over the second phase change layer; and
   forming a third metal layer over the second intermediate layer,
   wherein:
   the third metal layer is in direct physical contact with the third insulating layer;
   the first metal layer is configured as a bottom electrode of the of the PCRAM cell;
   the third metal layer is configured as a top electrode of the PCRAM cell;

the second selector layer is in direct physical contact with the second heater;

in a cross-sectional view, a length of a lowermost surface of the first selector layer in a first direction extending parallel to an upper surface of the substrate is shorter than a length of a lowermost surface of the second selector layer in the first direction; and in the cross-sectional view, a size length of each of the first phase change layer and the second phase change layer in the first direction is smaller than a length of the first metal layer in the first direction and smaller than a length of the third metal layer in the first direction.

2. The method of claim 1, wherein the first and second intermediate layers are made of carbon.

3. The method of claim 1, further comprising:
prior to the forming the first phase change layer, etching a top portion of the first heater to generate an opening for the first phase change layer.

4. The method of claim 1, wherein a length of the first intermediate layer is wider than a diameter of the first through hole in the cross-sectional view.

5. The method of claim 1, wherein the forming the first heater in the first through hole further comprises:
forming a plurality of single layers of the first heater in the first through hole, wherein the plurality of single layers of the first heater covers a bottom and walls of the first through hole, covers over a top surface of the first insulating layer, and fills the first through hole; and
polishing the first heater over the first insulating layer and over the first through hole until the top surface of the first insulating layer is exposed.

6. The method of claim 1, wherein the first intermediate layer, the second metal layer, and the second selector layer have a same length in the cross-sectional view.

7. A method of making a memory device, comprising:
forming a phase change random access memory (PCRAM) cell by performing operations comprising:
etching a first through hole in a first insulating layer that is disposed over a first metal layer;
forming a first heater in the first through hole over the first metal layer;
forming a first phase change layer in the first through hole over the first heater;
forming a first selector layer over the first phase change layer;
forming a second metal layer over the first selector layer;
forming a second selector layer over the second metal layer;
forming a second insulating layer over the first insulating layer, wherein the second insulating layer surrounds the second metal layer and the second selector layer;
forming a third insulating layer over the second insulating layer and over the second selector layer;
etching a second through hole in the third insulating layer;
forming a second heater in the second through hole over the second selector layer;
forming a second phase change layer in the second through hole over the second heater; and
forming a third metal layer over the second phase change layer,
wherein:
the third metal layer is in direct physical contact with the third insulating layer;
the first metal layer is configured as a bottom electrode of the of the PCRAM cell;

the third metal layer is configured as a top electrode of the PCRAM cell;
the second selector layer is in direct physical contact with the second heater;
in a cross-sectional view, a length of a lowermost surface of the first selector layer in a first direction extending parallel to an upper surface of the first metal layer is shorter than a length of a lowermost surface of the second selector layer in the first direction; and
in the cross-sectional view, a length of each of the first phase change layer and the second phase change layer in the first direction is smaller than a length of the first metal layer in the first direction and smaller than a length of the third metal layer in the first direction.

8. The method of claim 7, further comprising:
prior to the forming a first phase change layer, etching a top portion of the first heater to generate an opening for the first phase change layer; and
forming the first phase change layer by depositing one or more thin films of a phase change material.

9. The method of claim 7, wherein the forming the first heater in the first through hole further comprises:
forming a plurality of thin films of the first heater in the first through hole, wherein the plurality of thin films of the first heater covers a bottom and walls of the first through hole, covers over a top surface of the first insulating layer, and fills the first through hole; and
polishing the first heater over the first insulating layer and over the first through hole until the top surface of the first insulating layer is exposed.

10. The method of claim 7, wherein the first phase change layer is disposed in the first through hole and a bottom surface of the first phase change layer is in contact with a top surface of the first heater, and wherein the second phase change layer is disposed in the second through hole and a bottom surface of the second phase change layer is in contact with a top surface of the second heater.

11. The method of claim 7, wherein a length of the second metal layer is wider than a diameter of the first through hole.

12. The method of claim 7, further comprising:
forming a first intermediate layer comprising carbon over the first phase change layer.

13. The method of claim 12, wherein a diameter of the first through hole and a diameter of the second through hole are less than a length of the first intermediate layer in the cross-sectional view.

14. The method of claim 7, wherein:
prior to the forming the second metal layer, forming a first intermediate layer comprising carbon over the first selector layer and the first insulating layer, wherein the first intermediate layer is between the second metal layer and the first selector layer.

15. A method of making a memory device, comprising:
forming a phase change random access memory (PCRAM) cell by performing operations comprising:
forming a first insulating layer over a first metal layer;
etching a first through hole in the first insulating layer;
forming a first heater in the first through hole over the first metal layer;
forming a first phase change layer in the first through hole on the first heater;
forming a first selector layer in the first through hole over the first phase change layer;
forming a second insulating layer over the first insulating layer;

forming a second metal layer over the first selector layer;
forming a second selector layer over the second metal layer;
forming a third insulating layer over the second insulating layer;
etching a second through hole in the third insulating layer;
forming a second heater in the second through hole over the second selector layer;
forming a second phase change layer in the second through hole on the second heater; and
forming a third metal layer over the second phase change layer and the third insulating layer,
wherein:
the third metal layer is in direct physical contact with the third insulating layer;
the first metal layer is configured as a bottom electrode of the of the PCRAM cell;
the third metal layer is configured as a top electrode of the PCRAM cell;
the second selector layer is in direct physical contact with the second heater;
in a cross-sectional view, a length of a lowermost surface of the first selector layer in a first direction extending parallel to an upper surface of the first metal layer is shorter than a length of a lowermost surface of the second selector layer in the first direction; and
in the cross-sectional view, a length of each of the first phase change layer and the second phase change layer in the first direction is smaller than a length of the first metal layer in the first direction and smaller than a length of the third metal layer in the first direction.

16. The method of claim 15, further comprising forming a first intermediate layer over the first selector layer before forming the second metal layer.

17. The method of claim 16, further comprising forming a second intermediate layer in the second through hole over the second phase change layer before forming the third metal layer.

18. The method of claim 17, wherein the first intermediate layer and the second intermediate layer are made of carbon.

19. The method of claim 16, wherein a length of the first intermediate layer is greater than a diameter of the first through hole and a diameter of the second through hole in the cross-sectional view.

20. The method of claim 15, further comprising:
prior to the forming the first phase change layer, etching a top portion of the first heater to generate an opening for the first phase change layer.

* * * * *